United States Patent
Park et al.

(10) Patent No.: US 11,626,529 B2
(45) Date of Patent: Apr. 11, 2023

(54) LIGHT DETECTING DEVICE AND METHOD OF MANUFACTURING SAME

(71) Applicant: SAMSUNG ELECTRONICS CO., LTD., Suwon-si (KR)

(72) Inventors: Changyoung Park, Yongin-si (KR); Sanghun Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/173,339

(22) Filed: Feb. 11, 2021

(65) Prior Publication Data

US 2022/0102573 A1 Mar. 31, 2022

(30) Foreign Application Priority Data

Sep. 28, 2020 (KR) .................. 10-2020-0126375

(51) Int. Cl.
*H01L 31/103* (2006.01)
*H01L 31/0216* (2014.01)
*H01L 31/18* (2006.01)

(52) U.S. Cl.
CPC .... *H01L 31/1035* (2013.01); *H01L 31/02162* (2013.01); *H01L 31/184* (2013.01)

(58) Field of Classification Search
CPC ........... H01L 31/1035; H01L 31/02162; H01L 31/184; H01L 27/1443; H01L 31/02161; H01L 31/022416; H01L 31/0304; H01L 31/03046; H01L 31/035281; H01L 31/1852; H01L 31/105; H01L 31/1896;
(Continued)

(56) References Cited

U.S. PATENT DOCUMENTS

| 8,963,274 B2 | 2/2015 | Dixon |
| 2008/0210927 A1 | 9/2008 | Hudait et al. |
| 2011/0024863 A1 | 2/2011 | Koi et al. |

(Continued)

FOREIGN PATENT DOCUMENTS

| CN | 103915522 A | * | 7/2014 | ............ B82Y 20/00 |
| CN | 109461785 A | | 3/2019 | |

(Continued)

OTHER PUBLICATIONS

Martin et al. 640x512 InGaAs focal plane array camera for visible and SWIR imaging. May 31, 2005. SPIE. vol. 5783. pp. 11-20.*

(Continued)

*Primary Examiner* — Hoang-Quan Ho
(74) *Attorney, Agent, or Firm* — Sughrue Mion, PLLC

(57) ABSTRACT

A light detecting device includes a light absorbing layer configured to absorb light in a wavelength range from visible light to short-wave infrared (SWIR); a first semiconductor layer provided on a first surface of the light absorbing layer; an anti-reflective layer provided on the first semiconductor layer and comprising a material having etch selectivity with respect to the first semiconductor layer; and a second semiconductor layer provided on a second surface of the light absorbing layer. The first semiconductor layer has a thickness less than 500 nm so as to be configured to allow light to transmit therethrough in the wavelength range from visible light to SWIR.

17 Claims, 14 Drawing Sheets

(58) Field of Classification Search
CPC .. H01L 31/1075; G01J 1/44; G01J 2001/4446
See application file for complete search history.

(56) References Cited

U.S. PATENT DOCUMENTS

| | | | |
|---|---|---|---|
| 2015/0228685 A1* | 8/2015 | Uchida | H01L 31/022466 257/458 |
| 2018/0294301 A1 | 10/2018 | Wei et al. | |
| 2020/0105957 A1* | 4/2020 | Mathai | H01L 31/105 |

FOREIGN PATENT DOCUMENTS

| | | |
|---|---|---|
| KR | 10-2013-0071749 A | 7/2013 |
| KR | 10-1738939 B1 | 5/2017 |

OTHER PUBLICATIONS

Martin, Tara et al., "640x512 InGaAs focal plane array camera for visible and SWIR imaging", Proceedings of SPIE, vol. 5783, May 31, 2005, pp. 12-2 0, XP055644400. (10 pages total).
Ni, Y. et al., "Toward a single-chip TECless and NUCless InGaAs SWIR Camera with 120dB Intrinsic Operation Dynamic Range", Infrared Technology and Applications XXXVII, Proc. of SPIE, vol. 8012, No. 1, May 13, 2011, pp. 1-12, XP060016879. (12 pages total).
Communication dated Oct. 14, 2021 by the European Patent Office in counterpart European Patent Application No. 21166269.7.

\* cited by examiner

LIGHT DETECTING DEVICE AND METHOD OF MANUFACTURING SAME

CROSS-REFERENCE TO THE RELATED APPLICATION

This application is based on and claims priority under 35 U.S.C. § 119 to Korean Patent Application No. 10-2020-0126375, filed on Sep. 28, 2020, in the Korean Intellectual Property Office, the disclosure of which is incorporated by reference herein in its entirety.

BACKGROUND

1. Field

Embodiments of the present disclosure relate to light detecting devices and methods of manufacturing the same

2. Description of Related Art

In general, light detecting devices using indium gallium arsenide (InGaAs) are used to detect light in a short-wave infrared (SWIR) region, and light detecting devices using silicon are used to detect light in a visible region. In order to detect light in a wavelength range from visible light to SWIR, it is necessary to add light detecting devices using silicon to light detecting devices using InGaAs.

SUMMARY

Provided are light detecting devices and methods of manufacturing the same.

Additional aspects will be set forth in part in the description which follows and, in part, will be apparent from the description, or may be learned by practice of the presented embodiments of the disclosure.

According to one or more embodiments, a light detecting device is provided. The light detecting device includes: a light absorbing layer configured to absorb light in a wavelength range from visible light to short-wave infrared (SWIR); a first semiconductor layer provided on a first surface of the light absorbing layer; an anti-reflective layer provided on the first semiconductor layer and including a material having etch selectivity with respect to the first semiconductor layer; and a second semiconductor layer provided on a second surface of the light absorbing layer, wherein the first semiconductor layer has a thickness less than 500 nm so as to be configured to allow light to transmit therethrough in the wavelength range from visible light to SWIR.

According to an embodiment, the light absorbing layer includes As and at least one from among In, Ga, Al, and P.

According to an embodiment, each of the first semiconductor layer and the second semiconductor layer includes P and at least one from among In, Ga, Al, and As.

According to an embodiment, the anti-reflective layer includes As and at least one from among In, Ga, Al, and P.

According to an embodiment, the anti-reflective layer further includes a dopant.

According to an embodiment, the thickness of the first semiconductor layer is 10 nm to 300 nm.

According to an embodiment, the anti-reflective layer has a thickness equal to or greater than 1 nm.

According to one or more embodiments, a light detecting device array is provided. The light detecting device array includes a plurality of the light detecting device, wherein the plurality of the light detecting device are arranged one-dimensionally or two-dimensionally.

According to one or more embodiments, a light detecting system is provided. The light detecting system includes: a light source; and at least one light detecting device configured to detect light, reflected from an object, that is emitted from the light source. Each of the at least one light detecting device includes: a light absorbing layer configured to absorb light in a wavelength range from visible light to short-wave infrared (SWIR); a first semiconductor layer provided on a first surface of the light absorbing layer; an anti-reflective layer provided on the first semiconductor layer and including a material having etch selectivity with respect to the first semiconductor layer; and a second semiconductor layer provided on a second surface of the light absorbing layer, wherein the first semiconductor layer has a thickness less than 500 nm so as to be configured to allow light to transmit therethrough in the wavelength range from visible light to SWIR.

According to one or more embodiments, a method of manufacturing a light detecting device is provided. The method includes: sequentially forming, on a substrate, an anti-reflective layer, a first semiconductor layer, a light absorbing layer, a second semiconductor layer, and an electrode; attaching the electrode to a circuit substrate; and removing the substrate by etching, wherein the first semiconductor layer is formed to a thickness less than 500 nm, and the anti-reflective layer includes a material having an etch selectivity with respect to the first semiconductor layer.

According to an embodiment, the light absorbing layer includes As and at least one from among In, Ga, Al, and P, and each of the first semiconductor layer and the second semiconductor layer includes P and at least one from among In, Ga, Al, and As.

According to an embodiment, the anti-reflective layer includes As and at least one from among In, Ga, Al, and P.

According to an embodiment, the thickness of the first semiconductor layer is 10 nm to 300 nm.

According to an embodiment, the anti-reflective layer has a thickness equal to or greater than 1 nm.

According to an embodiment, the substrate includes an InP substrate.

According to an embodiment, the substrate includes a Si substrate, a Ge substrate, or a GaAs substrate.

According to one or more embodiments, a method of manufacturing a light detecting device is provided. The method includes: sequentially forming, on a substrate, an anti-reflective layer, a first semiconductor layer, a light absorbing layer, and a second semiconductor layer; bonding the second semiconductor layer to a support substrate; and removing the substrate by etching, wherein the first semiconductor layer is formed to a thickness less than 500 nm, and the anti-reflective layer includes a material having an etch selectivity with respect to the first semiconductor layer.

According to an embodiment, the method further includes: forming a mesa structure by sequentially etching the anti-reflective layer, the first semiconductor layer, the light absorbing layer, and the second semiconductor layer; and forming electrodes electrically connected to the first semiconductor layer and the second semiconductor layer.

According to an embodiment, the second semiconductor layer is bonded to the support substrate by wafer bonding.

According to an embodiment, the substrate includes an InP substrate, a Si substrate, a Ge substrate, or a GaAs substrate.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
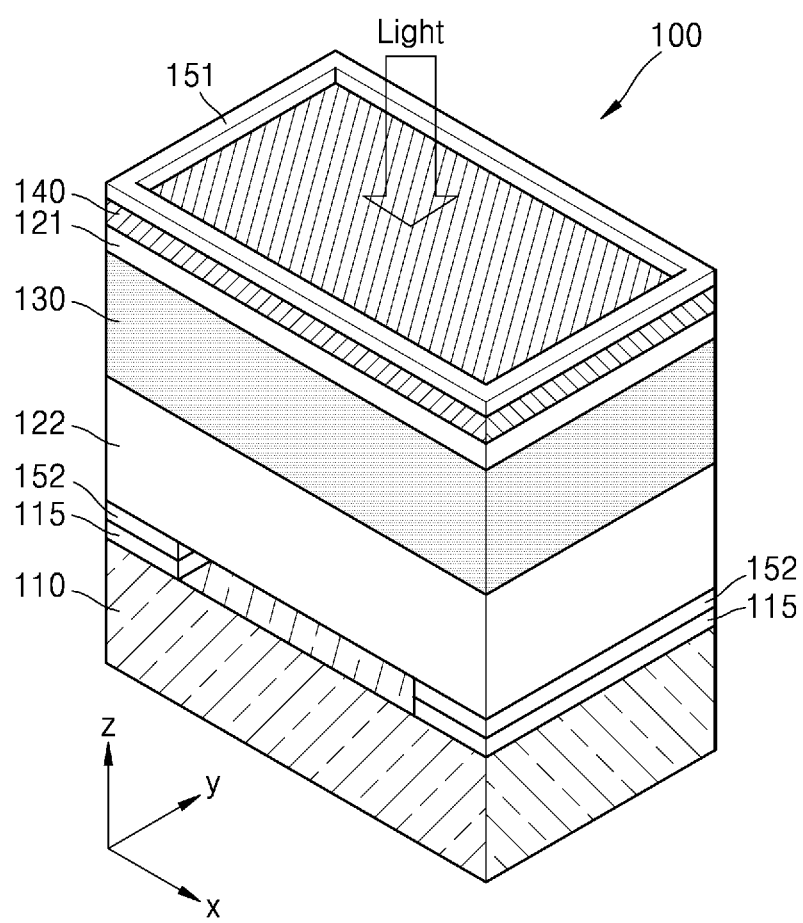
FIG. 1 is a perspective view illustrating a light detecting device according to an embodiment.

Reference will now be made in detail to embodiments, examples of which are illustrated in the accompanying drawings, wherein like reference numerals refer to like elements throughout. In this regard, the present embodiments may have different forms and various modifications and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described with reference to the accompanying drawings. In the drawings, like reference numerals refer to like elements, and the sizes of elements may be exaggerated for clarity of illustration. The embodiments described herein are for illustrative purposes only, and various modifications may be made therein.

In the following description, when an element is referred to as being "above" or "on" another element, it may be directly on the other element while making contact with the other element or may be above the other element without making contact with the other element. The terms of a singular form may include plural forms unless otherwise mentioned. It will be further understood that the terms "comprises" and/or "comprising" used herein specify the presence of stated features or elements, but do not preclude the presence or addition of one or more other features or elements.

An element referred to with the definite article or a demonstrative pronoun may be construed as the element or the elements even though it has a singular form. Operations of a method may be performed in an appropriate order unless explicitly described in terms of order or described to the contrary, and are not limited to the stated order thereof.

In the present disclosure, terms such as "unit" or "module" may be used to denote a unit that has at least one function or operation and is implemented with hardware, software, or a combination of hardware and software.

Furthermore, line connections or connection members between elements depicted in the drawings represent functional connections and/or physical or circuit connections by way of example, and in actual applications, they may be replaced or embodied with various additional functional connections, physical connections, or circuit connections.

Examples or exemplary terms are merely used herein to describe technical ideas and should not be considered for purposes of limitation unless defined by the claims.

FIG. 1 is a perspective view illustrating a light detecting device 100 according to an embodiment.

Referring to FIG. 1, the light detecting device 100 may include a light absorbing layer 130, a first semiconductor layer 121, a second semiconductor layer 122, and a low reflective layer 140 (e.g. an anti-reflective layer). Here, the first semiconductor layer 121/the light absorbing layer 130/ the second semiconductor layer 122 may form a p-i-n junction.

The light absorbing layer 130 may include a semiconductor compound that absorbs light in a wavelength range from visible light to short-wave infrared (SWIR). The light absorbing layer 130 may include at least one of In, Ga, Al, and P, and As. For example, the light absorbing layer 130 may include GaAs, InxGaAs (0.05≤x≤0.85), InxGaAlyAs (0.05≤x≤0.85, 0.01≤y≤0.75) or InxGaAsPz (0.05≤x≤0.85, 0.05≤z≤0.75) However, this is merely an example. As a specific example, the light absorbing layer 130 may include InGaAs.

The light absorbing layer 130 may have, for example, a structure in which at least one quantum barrier and at least one quantum well are alternately stacked. Each quantum barrier may be formed to a thickness of, for example, about 2 nm to 50 nm, and each quantum well may be formed to a thickness of, for example, about 1 nm to 25 nm, but the disclosure is not limited thereto. Meanwhile, the light absorbing layer 130 may include quantum dots (QD) or quantum wires instead of quantum wells. The light absorbing layer 130 may adjust an absorption wavelength band by adjusting at least one of its shape, material, and thickness.

Figure 2:
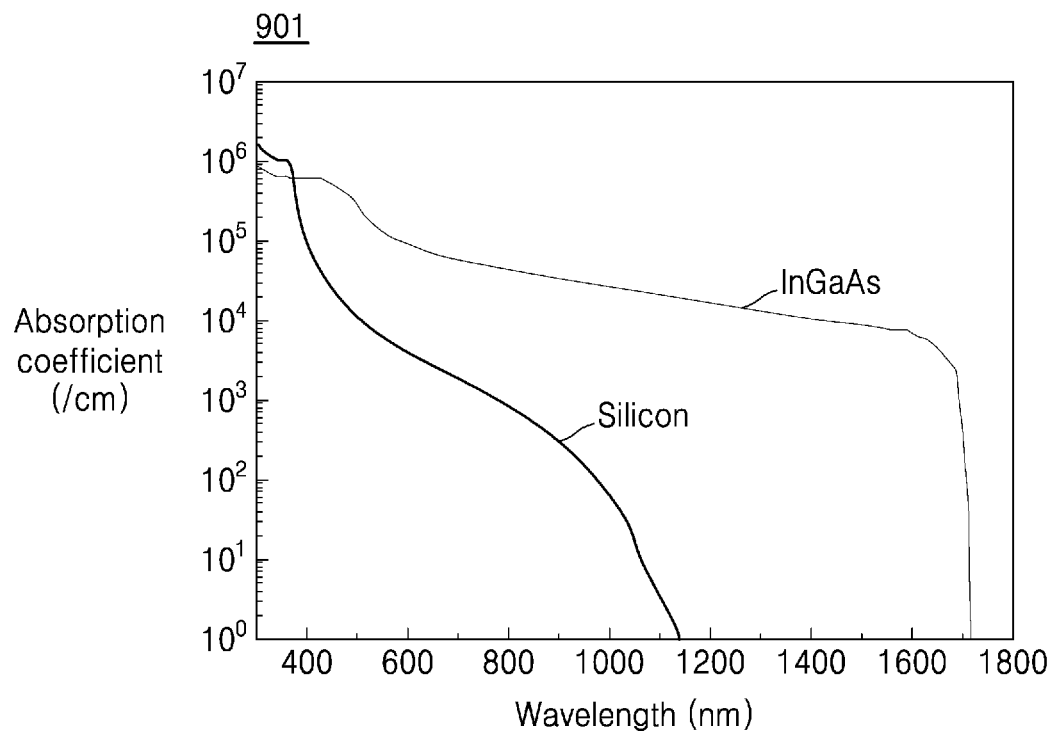
FIG. 2 shows light absorption characteristics of an InGaAs material and a silicon material.

The graph 901 illustrated in FIG. 2 shows light absorption characteristics of an InGaAs material and a silicon material. Referring to FIG. 2, the silicon material may absorb light in a wavelength range of approximately 350 nm to 1150 nm, and the InGaAs material may absorb light in a wavelength range of approximately 350 nm to 1750 nm. Thus, a light detecting device that uses silicon as a light absorbing material may detect light in the visible region only, whereas a light detecting device that uses InGaAs as a light absorbing material may detect light in a wavelength range from visible light to SWIR.

A first semiconductor layer 121 is provided on a first surface (the upper surface of the light absorbing layer 130 in FIG. 1) that is a light incident surface of the light absorbing layer 130, and a second semiconductor layer 122 is provided on a second surface (the lower surface of the light absorbing layer 130 in FIG. 1) that is a surface opposite to the first surface of the light absorbing layer 130. The first semiconductor layer 121/the light absorbing layer 130/the second semiconductor layer 122 may form a p-i-n junction. The first semiconductor layer 121 and the second semiconductor layer 122 may be p-type and n-type semiconductor layers, respectively. However, embodiments of the present disclosure are not necessarily limited thereto, and the first semiconductor layer 121 and the second semiconductor layer 122 may be n-type and p-type semiconductor layers, respectively.

Each of the first semiconductor layer 121 and the second semiconductor layer 122 may include a material including at least one of In, Ga, Al, and As and P, and a certain dopant. Here, the certain dopant may include, for example, C, Si, Zn, and Mg, but is not limited thereto. For example, when the first semiconductor layer 121 is a p-type semiconductor layer, the first semiconductor layer 121 may include InP and a p-type dopant such as Zn, Mg, etc. In addition, when the second semiconductor layer 122 is an n-type semiconductor layer, the second semiconductor layer 122 may include InP and an n-type dopant such as C, Si, etc.

The first semiconductor layer 121 provided on the first surface which is the light incident surface of the light absorbing layer 130 may be configured to make light transmit therethrough within a wavelength range of visible light to SWIR. To this end, the first semiconductor layer 121 may have, for example, a thickness less than about 500 nm. For example, the first semiconductor layer 121 may have a thickness of approximately 10 nm to 300 nm (e.g., 10 nm to 100 nm).

Figure 3:
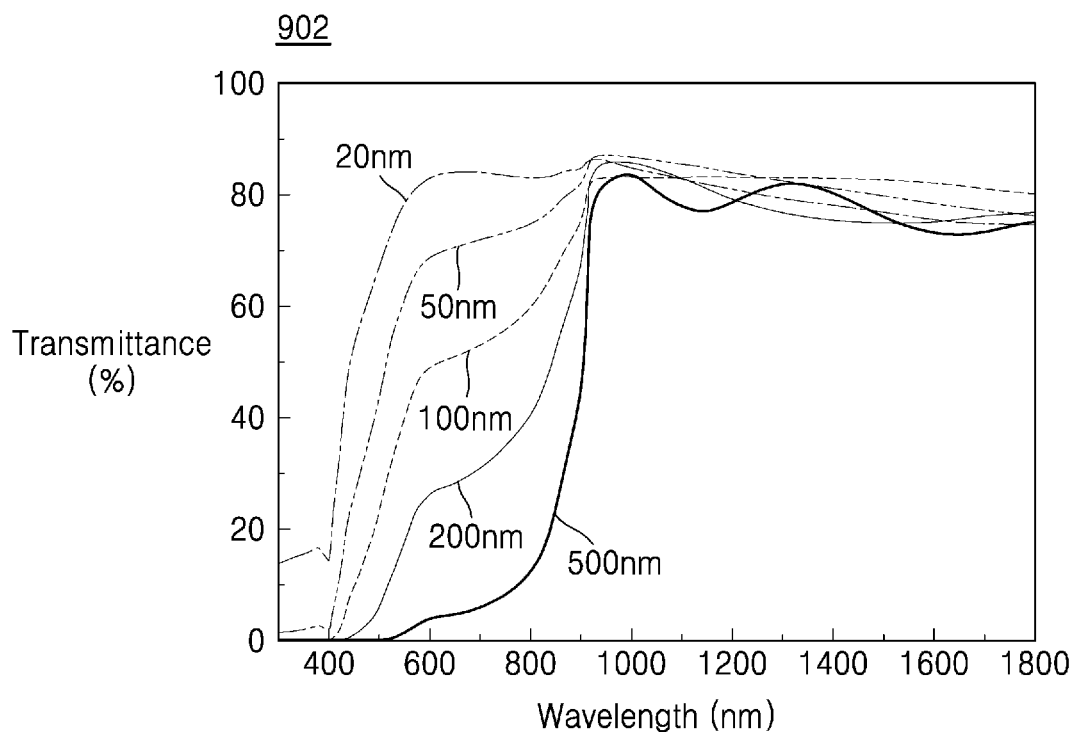
FIG. 3 is a simulation result showing a transmission wavelength according to the thickness of an InP layer.

FIG. 3 illustrates a graph 902 that is a simulation result showing a transmission wavelength according to the thickness of an InP layer. Referring to FIG. 3, as the thickness of the InP layer decreases, the transmittance of light in a visible light region may gradually increase. When the InP layer has a thickness equal to or greater than 500 nm, the transmittance of light in the visible light region is low, and thus only light in a SWIR region may be transmitted. However, when the InP layer has a thickness less than about 500 nm, the InP layer may make light transmit therethrough in a wavelength range from visible light to SWIR. As a more specific example, when the InP layer has a thickness equal to or less than about 200 nm (e.g., equal to or less than 100 nm), the InP layer may make light transmit therethrough within a wavelength range of about 400 nm to 1750 nm.

The second semiconductor layer 122 provided on the second surface opposite to the first surface of the light absorbing layer 130 may have a thickness of, for example, about 10 nm to 1000 nm, but is not limited thereto.

The low reflective layer 140 is provided on the first semiconductor layer 121. The low reflective layer 140 may perform a function of preventing reflection of incident light, a function of mechanically, chemically, and electrically protecting the first semiconductor layer 121 of a thin thickness, a function of reducing contact resistance, and a function of an etch stop layer during a process of manufacturing the light detecting device 100 that will be described later, etc.

The low reflective layer 140 may form lattice matching with the material of the first semiconductor layer 121, and may include a transparent material having etch selectivity with respect to the material of the first semiconductor layer 121. For example, the low reflective layer 140 may include at least one of In, Ga, Al, and P, and As. As a specific example, the low reflective layer 140 may include InGaAs, InAlAs, InAlAsP, AlAsSb, InAlAs, or $(InAs)_x(AlP)_{1-x}$ (0<x<1). However, this is merely an example.

The low reflective layer 140 may further include a certain dopant. For example, when the first semiconductor layer 121 is a p-type semiconductor layer, the low reflective layer 140 may further include a p-type dopant such as Zn or Mg. In addition, when the first semiconductor layer 121 is an n-type semiconductor layer, the low reflective layer 140 may further include an n-type dopant such as C or Si.

The low reflective layer 140 may have a single layer structure. Alternatively, the low reflective layer 140 may have a multilayer structure in which a plurality of material layers having different composition components or composition ratios are stacked. The low reflective layer 140 may have a thickness that is tolerable by a dry etching process or a wet etching process during a manufacturing process of the light detecting device 100 that will be described later. For example, the low reflective layer 140 may have a thickness, for example, equal to or greater than approximately 1 nm.

Meanwhile, although not shown in the drawings, a first contact layer may be further provided on the low reflective layer 140, and a second contact layer may be further provided on the second semiconductor layer 122. The first and second contact layers may be p-type and n-type contact layers, respectively. Alternatively, the first and second contact layers may be n-type and p-type contact layers, respectively.

Each of the first and second contact layers may include a material including, for example, a dopant such as Si, C, Zn, or Mg in at least one of In, Ga, Al, As, and P. As a specific example, each of the first and second contact layers may have a material including a certain dopant in InxGaAs (0.1≤x≤0.3), InxGaAlyAs (0.05≤x≤0.85, 0.01≤y≤1), InxGaAsPz (0.05≤x≤0.85, 0.05≤z≤1) or, InP.

A first electrode 151 is provided on the upper surface of the low reflective layer 140. The first electrode 151 may be electrically connected to the first semiconductor layer 121 through the low reflective layer 140. In addition, a second electrode 152 is provided on the lower surface of the second semiconductor layer 122. Each of the first electrode 151 and the second electrode 152 may include a metal material having excellent conductivity. When the first semiconductor layer 121 and the second semiconductor layer 122 are p-type and n-type layers, respectively, the first electrode 151 and the second electrode 152 may be p-type and n-type electrodes, respectively.

The light detecting device 100 may be bonded to a circuit board 110 including a readout circuit. Here, the second electrode 152 of the light detecting device 100 may be bonded to the conductive layer 115 of the circuit board 110.

In the light detecting device 100 according to the present embodiment, the first semiconductor layer 121 provided on the first surface which is the light incident surface of the light absorbing layer 130 is provided to have a thickness smaller than 500 nm, thereby making light transmitted therethrough in a wavelength range from visible light to SWIR, and accordingly, the light detecting device 100 having a broadband characteristic may be implemented. In addition, the low reflective layer 140 provided on the first semiconductor layer 121 may prevent reflection of incident light, mechanically, chemically, and electrically protect the first semiconductor layer 121 of the thin thickness, and perform the function of an etch stop layer, etc. during the manufacturing process of the light detecting device 100.

Figure 4:
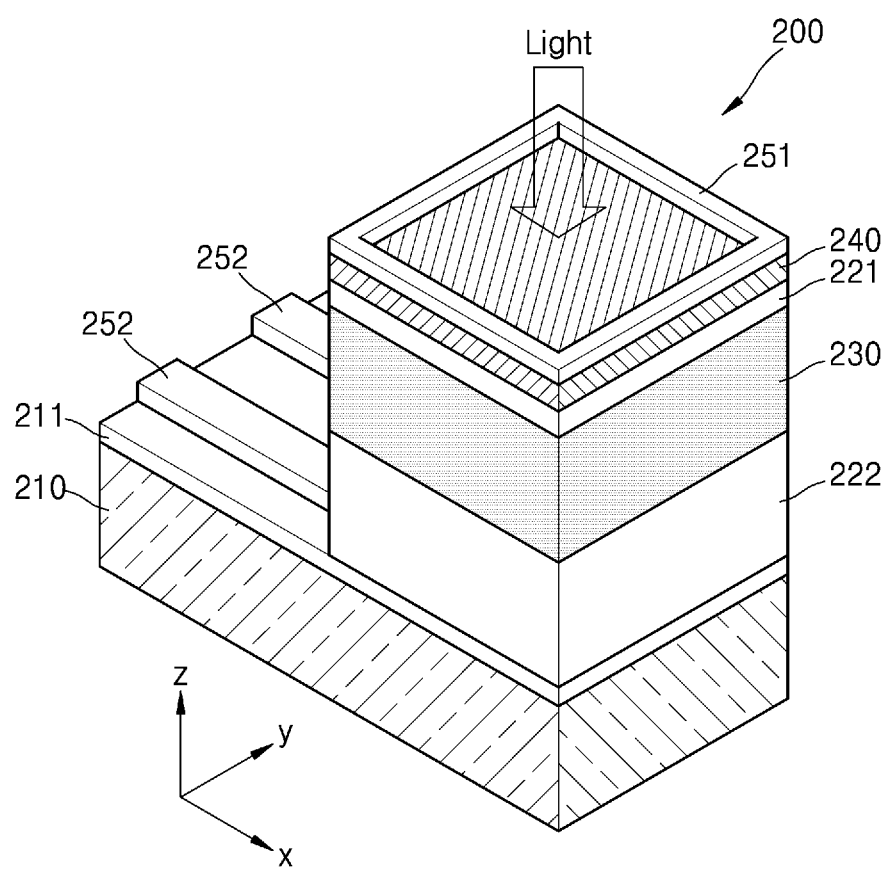
FIG. 4 is a perspective view showing a light detecting device according to another embodiment.

FIG. 4 is a perspective view showing a light detecting device 200 according to another embodiment. Hereinafter, differences from the above-described embodiment will be mainly described.

Referring to FIG. 4, the light detecting device 200 may include a light absorbing layer 230, first semiconductor layer 221, second semiconductor layer 222, and a low reflective layer 240 (e.g. anti-reflective layer). The light absorbing layer 230 may include a semiconductor compound that absorbs light in a wavelength range from visible light to SWIR. The light absorbing layer 230 may include at least one of In, Ga, Al, and P, and As.

A first semiconductor layer 221 is provided on a first surface (the upper surface of the light absorbing layer 230 in FIG. 4) that is a light incident surface of the light absorbing layer 230, and a second semiconductor layer 222 is provided on a second surface (the lower surface of the light absorbing layer 230 in FIG. 4) that is a surface opposite to the first surface of the light absorbing layer 230. The first semiconductor layer 221 and the second semiconductor layer 222 may be p-type and n-type semiconductor layers, respectively, but are not limited thereto.

Each of the first semiconductor layer 221 and the second semiconductor layer 222 may include a material including at least one of In, Ga, Al, and As and P, and a certain dopant. Here, the certain dopant may include, for example, C, Si, Zn, and Mg, but is not limited thereto.

The first semiconductor layer 221 provided on the first surface which is the light incident surface of the light absorbing layer 230 may be configured to make light transmit therethrough in a wavelength range from visible light to SWIR. To this end, the first semiconductor layer 221 may have, for example, a thickness less than about 500 nm. For example, the first semiconductor layer 221 may have a thickness of approximately 10 nm to 300 nm (e.g., 10 nm to 100 nm). The second semiconductor layer 222 provided on the second surface opposite to the first surface of the light absorbing layer 230 may have a thickness of, for example, about 10 nm to 1000 nm, but is not limited thereto.

The low reflective layer 240 is provided on the first semiconductor layer 221. The low reflective layer 240 may form lattice matching with the material of the first semiconductor layer 221, and may include a transparent material having etch selectivity with respect to the material of the first semiconductor layer 221. For example, the low reflective layer 240 may include at least one of In, Ga, Al, and P, and As. The low reflective layer 240 may further include a certain dopant.

The low reflective layer 240 may have a single layer structure. Alternatively, the low reflective layer 240 may have a multilayer structure in which a plurality of material layers having different composition components or composition ratios are stacked. For example, the low reflective layer 240 may have a thickness equal to or greater than approximately 1 nm.

The light detecting device 200 may be bonded to a support substrate 210 by an adhesive layer 211. The light detecting device 200 may be configured to have a mesa structure on the support substrate 210. A first electrode 251 is provided on the upper surface of the low reflective layer 240. In addition, a second electrode 252 electrically connected to the second semiconductor layer 222 is provided on the support substrate 210.

The light detecting device 100 and/or the light detecting device 200 according to the embodiments described above may be provided in plural, and the plurality of the light detecting device 100 and/or the light detecting device 200 are arranged one-dimensionally or two-dimensionally to constitute a light detecting device array.

Hereinafter, a method of manufacturing a light detecting device will be described.

FIGS. 5 to 8 are diagrams illustrating a method of manufacturing a light detecting device 300 according to an embodiment.

Figure 5:
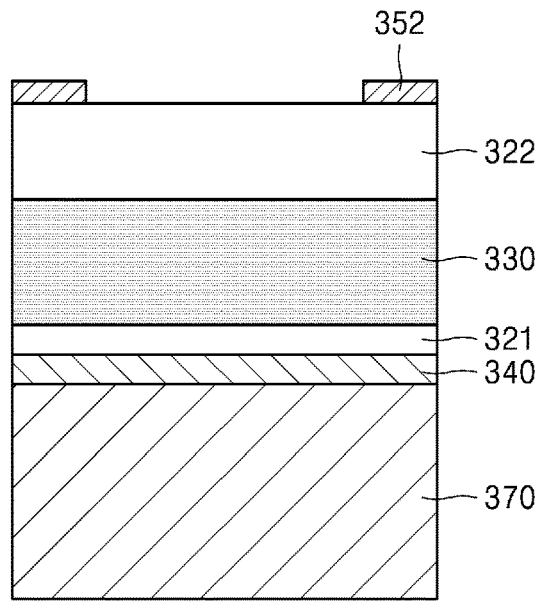
FIG. 5 is a first diagram illustrating a method of manufacturing a light detecting device, according to an embodiment.

Referring to FIG. 5, an InP substrate 370 is prepared. Here, for example, an InP wafer may be used as the InP substrate 370. In addition, a low reflective layer 340, a first semiconductor layer 321, a light absorbing layer 330, and a second semiconductor layer 322 are sequentially formed on the InP substrate 370 by epitaxial growth. Here, the epitaxial growth of the low reflective layer 340, the first semiconductor layer 321, the light absorbing layer 330, and the second semiconductor layer 322 may be performed by, for example, metal organic chemical vapor deposition (MOCVD).

Specifically, a low reflective layer 340 is deposited on the upper surface of the InP substrate 370. As described above, the low reflective layer 340 may perform a function of preventing reflection of incident light, a function of mechanically, chemically and electrically protecting the first semiconductor layer 321 of a thin thickness, a function of reducing contact resistance, and a function of an etch stop layer during an etching process of the InP substrate 370 that will be described later.

The low reflective layer 340 may form lattice matching with the material of the first semiconductor layer 321 and may include a transparent material having etch selectivity with respect to the material of the first semiconductor layer 321. For example, the low reflective layer 340 may include at least one of In, Ga, Al, and P, and As. As a specific example, the low reflective layer 340 may include InGaAs, InAlAs, InAlAsP, AlAsSb, InAlAs, or $(InAs)_x(AlP)_{1-x}$ ($0<x<1$). However, this is merely an example.

The low reflective layer 340 may further include a certain dopant. Here, the dopant may include, for example, a p-type dopant such as Zn or Mg, or an n-type dopant such as C or Si.

The low reflective layer 340 may be formed in a single layer structure or may be formed in a multilayer structure in which different materials are stacked. The low reflective layer 340 may have a thickness that is tolerable by dry etching or wet etching during an etching process of the InP substrate 370 that will be described later. For example, the low reflective layer 340 may have a thickness, for example, equal to or greater than approximately 1 nm. However, this is merely an example.

Next, a p-i-n junction structure is formed on the upper surface of the low reflective layer 340. Specifically, the first semiconductor layer 321 is deposited on the upper surface of the low reflective layer 340. The first semiconductor layer 321 may include a material including at least one of In, Ga, Al, and As and P, and a certain dopant. For example, when the first semiconductor layer 321 is a p-type semiconductor layer, the first semiconductor layer 321 may include InP and the p-type dopant. In addition, when the first semiconductor layer 321 is an n-type semiconductor layer, the first semiconductor layer 321 may include InP and the n-type dopant.

The first semiconductor layer 321 may have a thin thickness so as to make light transmit therethrough in a wavelength range from visible light to SWIR. The first semiconductor layer 321 may have, for example, a thickness less than about 500 nm. For example, the first semiconductor layer 321 may have a thickness of approximately 10 nm to 300 nm (e.g., 10 nm to 100 nm).

A light absorbing layer 330 is deposited on the upper surface of the first semiconductor layer 321. The light absorbing layer 330 may include a semiconductor compound that absorbs light in a wavelength range from visible to SWIR. The light absorbing layer 330 may include at least one of In, Ga, Al, and P, and As. For example, the light absorbing layer 330 may include GaAs, InxGaAs (0.05≤x≤0.85), InxGaAlyAs (0.05≤x≤0.85, 0.01≤y≤0.75) or InxGaAsPz (0.05≤x≤0.85, 0.05≤z≤0.75). However, this is merely an example. As a specific example, the light absorbing layer 330 may include InGaAs. The light absorbing layer 330 may have, for example, a structure in which at least one quantum barrier and at least one quantum well are alternately stacked. Meanwhile, the light absorbing layer 330 may include quantum dots (QD) or quantum wires instead of quantum wells.

A second semiconductor layer 322 is deposited on the upper surface of the light absorbing layer 330. When the first semiconductor layer 321 is a p-type semiconductor layer, the second semiconductor layer 322 may be an n-type semiconductor layer. Alternatively, when the first semiconductor layer 321 is an n-type semiconductor layer, the second semiconductor layer 322 may be a p-type semiconductor layer.

The second semiconductor layer 322 may include a material including at least one of In, Ga, Al, and As and P, and a certain dopant. For example, when the second semiconductor layer 322 is an n-type semiconductor layer, the second semiconductor layer 322 may include InP and an n-type dopant. In addition, when the second semiconductor layer 322 is a p-type semiconductor layer, the second semiconductor layer 322 may include InP and a p-type dopant.

A second electrode 352 is formed on the upper surface of the second semiconductor layer 322. When the second semiconductor layer 322 is an n-type semiconductor layer, the second electrode 352 may be an n-type electrode. Alternatively, when the second semiconductor layer 322 is a p-type semiconductor layer, the second electrode 352 may be a p-type electrode.

Figure 6:
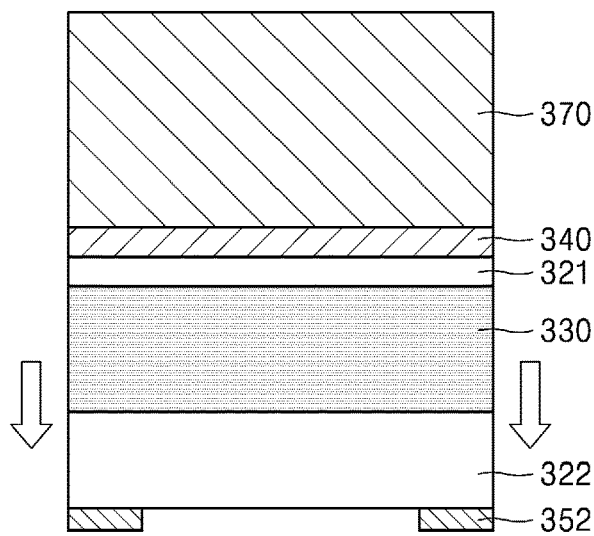
FIG. 6 is a second diagram illustrating the method of manufacturing the light detecting device, according to the embodiment.
Figure 6:
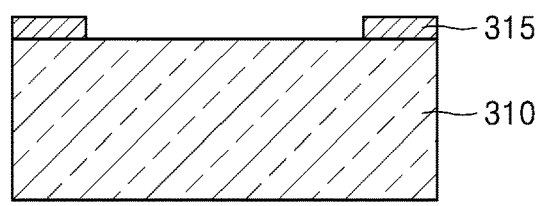

Referring to FIG. 6, the structure shown in FIG. 5 is turned over and bonded to a circuit substrate 310. Here, the second electrode 352 formed on the second semiconductor layer 322 may be bonded to a conductive layer 315 formed on the circuit substrate 310. Here, when an InP wafer is used as the InP substrate 370, the circuit substrate 310 may have a size corresponding to the InP wafer.

Figure 7:
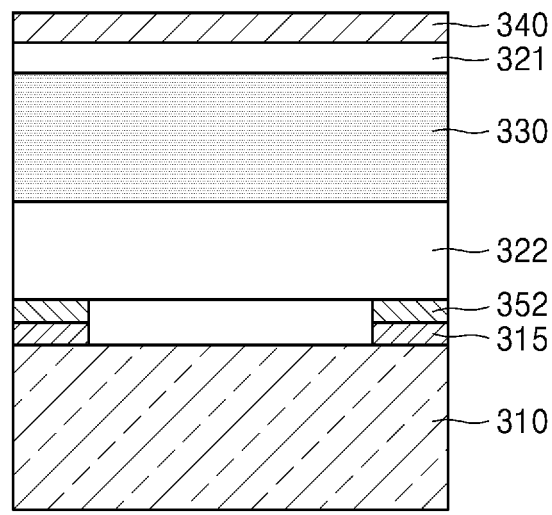
FIG. 7 is a third diagram illustrating the method of manufacturing the light detecting device, according to the embodiment.

Referring to FIG. 7, in the state shown in FIG. 6, the InP substrate 370 is removed through an etching process. Here, removal of the InP substrate 370 may be performed by wet etching or dry etching. As described above, because the low reflective layer 340 includes a material having etch selectivity with respect to InP, only the InP substrate 370 may be removed by the etching process, and the low reflective layer 340 may remain on the first semiconductor layer 321.

Figure 8:
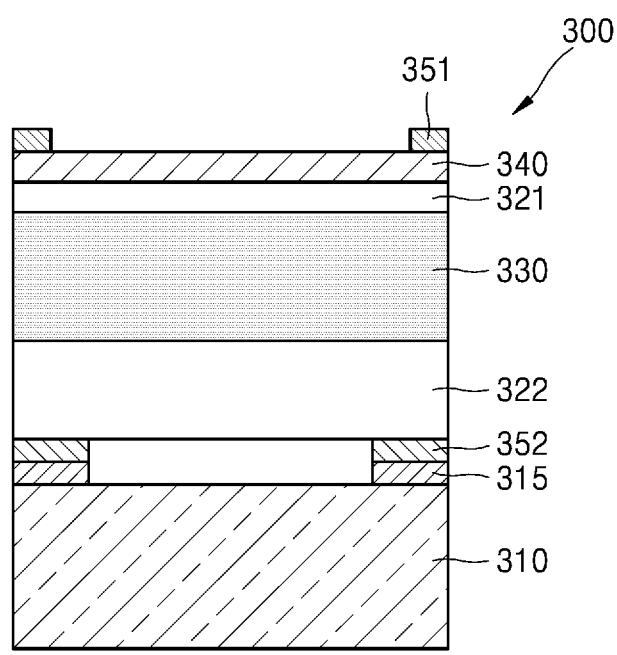
FIG. 8 is a fourth diagram illustrating the method of manufacturing the light detecting device, according to the embodiment.

Referring to FIG. 8, the light detecting device 300 is manufactured by forming the first electrode 351 on the upper surface of the low reflective layer 340. When the first semiconductor layer 321 is a p-type semiconductor layer, the first electrode 351 may be a p-type electrode, and when the first semiconductor layer 321 is an n-type semiconductor layer, the first electrode 351 may be an n-type electrode. The first electrode 351 may be provided on the edge of the low reflective layer 340 such that external light may be effectively incident on the low reflective layer 340, but is not necessarily limited thereto.

There is a limit to reduction in the thickness of the InP layer by using a mechanical method in the light detecting device of InP/InGaAs/InP structure according to the related art. However, in the present embodiment, the first semiconductor layer 321 is deposited to a thin thickness on the light absorbing layer 330, the low reflective layer 340 that is transparent and has etch selectivity with respect to the first semiconductor layer 321 is deposited thereon, and then the InP substrate 370 is removed by etching, thereby manufacturing the light detecting device 300 capable of detecting light in a wavelength range from visible light to SWIR.

FIGS. 9 to 12 are diagrams illustrating a method of manufacturing a light detecting device 400 according to another embodiment. Hereinafter, differences from the above-described embodiment will be mainly described.

Figure 9:
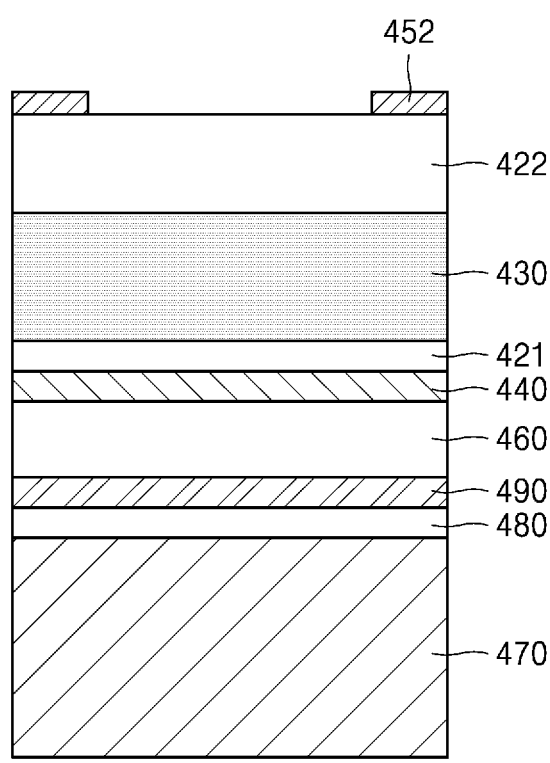
FIG. 9 is a first diagram illustrating a method of manufacturing a light detecting device, according to another embodiment.

Referring to FIG. 9, a Si substrate 470 is prepared. Here, as the Si substrate 470, for example, a Si wafer may be used. In addition, a first material layer 480, a second material layer 490, and a buffer layer 460 are sequentially formed on the Si substrate 470 by epitaxial growth.

The first material layer 480 may be formed by depositing at least one of, for example, Ge, GaP, and AlP on the upper surface of the Si substrate 470, and the second material layer 490 may be formed by depositing at least one of, for example, GaAs and AlAs on the upper surface of the first material layer 480. In addition, the buffer layer 460 may be formed by depositing, for example, InP on the upper surface of the second material layer 490.

It is described above that the Si substrate 470 is used. However, a Ge substrate or a GaAs substrate may be used instead of the Si substrate 470. When a Ge substrate (not shown) is used, a material layer including, for example, at least one of GaAs and AlAs may be formed on the upper surface of the Ge substrate, and a buffer layer including InP may be formed thereon. In addition, when a GaAs substrate (not shown) is used, the buffer layer including InP may be formed on the upper surface of the GaAs substrate. Meanwhile, substrates of various materials such as a glass substrate or a sapphire substrate may be used.

Subsequently, a low reflective layer 440 is deposited on the upper surface of the buffer layer 460. The low reflective layer 440 may form lattice matching with the material of the first semiconductor layer 421, and may include a transparent material having etch selectivity with respect to the material of the first semiconductor layer 421. For example, the low reflective layer 440 may include at least one of In, Ga, Al, and P, and As. The low reflective layer 440 may further include a certain dopant. The low reflective layer 440 may be formed in a single layer structure or may be formed in a multilayer structure in which different materials are stacked. For example, the low reflective layer 440 may have a thickness, for example, equal to or greater than approximately 1 nm.

Next, a p-i-n junction structure is formed on the upper surface of the low reflective layer 440. Specifically, the first semiconductor layer 421 is deposited on the upper surface of the low reflective layer 440. Here, the first semiconductor layer 421 may include a material including at least one of In, Ga, Al, and As and P, and a certain dopant. For example, the first semiconductor layer 421 may include InP and a p-type dopant.

The first semiconductor layer 421 may be formed to have a thickness less than approximately 500 nm (e.g., about 10 nm to 300 nm, for example, 10 nm to 100 nm) so as to make light transmit therethrough in a wavelength range from visible light to SWIR.

A light absorbing layer 430 is deposited on the upper surface of the first semiconductor layer 421. The light absorbing layer 430 may include a semiconductor compound that absorbs light in a wavelength range from visible to SWIR. The light absorbing layer 430 may include at least one of In, Ga, Al, and P, and As.

A second semiconductor layer 422 is deposited on the upper surface of the light absorbing layer 430. The second semiconductor layer 422 may include a material including at least one of In, Ga, Al, and As and P, and a certain dopant. For example, the second semiconductor layer 422 may include InP and an n-type dopant. A second electrode 452 is formed on the upper surface of the second semiconductor layer 422.

Figure 10:
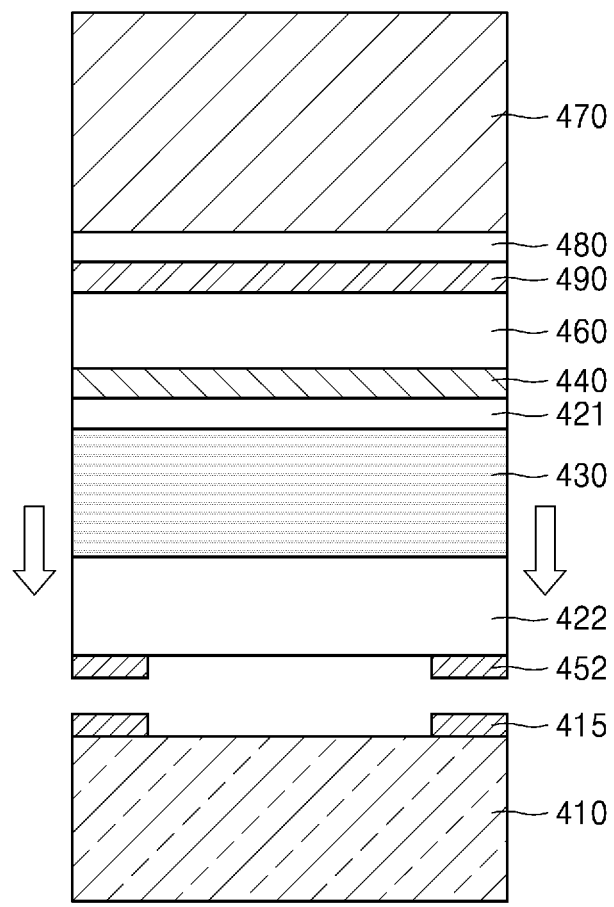
FIG. 10 is a second diagram illustrating the method of manufacturing the light detecting device, according to the another embodiment.

Referring to FIG. 10, the structure shown in FIG. 9 is turned over and bonded to a circuit substrate 410. Here, the second electrode 452 formed on the second semiconductor layer 422 may be bonded to a conductive layer 415 formed on the circuit substrate 410. Here, when a Si wafer is used as the Si substrate 470, the circuit substrate 410 may have a size corresponding to the Si wafer. In this case, the structure shown in FIG. 9 and the circuit substrate 410 may be bonded by wafer bonding.

Figure 11:
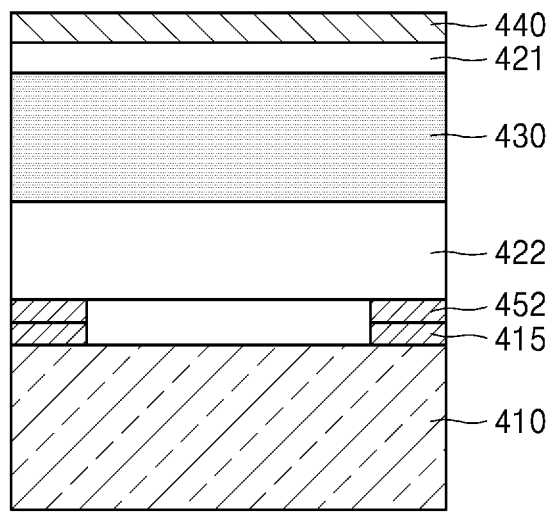
FIG. 11 is a third diagram illustrating the method of manufacturing the light detecting device, according to the another embodiment.

Referring to FIG. 11, the Si substrate 470, a first material layer 480, a second material layer 490, and a buffer layer 460 are removed through an etching process. As described above, because the low reflective layer 440 includes a material having etch selectivity with respect to InP, only the Si substrate 470, the first material layer 480, the second material layer 490 and the buffer layer 460 are removed, and the low reflective layer 440 may remain on the first semiconductor layer 421.

Figure 12:
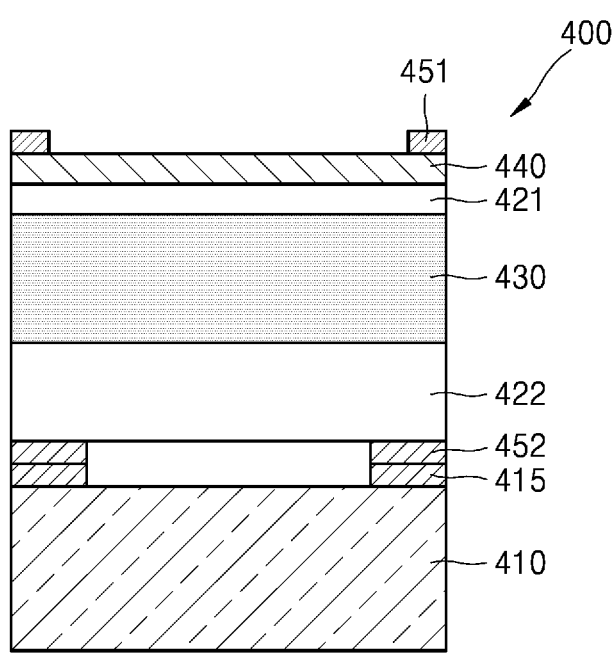
FIG. 12 is a fourth diagram illustrating the method of manufacturing the light detecting device, according to the another embodiment.

Referring to FIG. 12, the light detecting device 400 is manufactured by forming a first electrode 451 on the upper surface of the low reflective layer 440. Here, the first electrode 451 may be provided on an edge of the low reflective layer 440 such that external light may be effectively incident on the low reflective layer 440.

In the present embodiment, the light detecting device 400 may be mass-produced at a relatively low cost by using a Si wafer that is relatively inexpensive compared to an InP wafer and may have the same size as a circuit board.

FIGS. 13 to 17 are diagrams illustrating a method of manufacturing a light detecting device 500 according to still another embodiment. Hereinafter, differences from the above-described embodiment will be mainly described.

Figure 13:
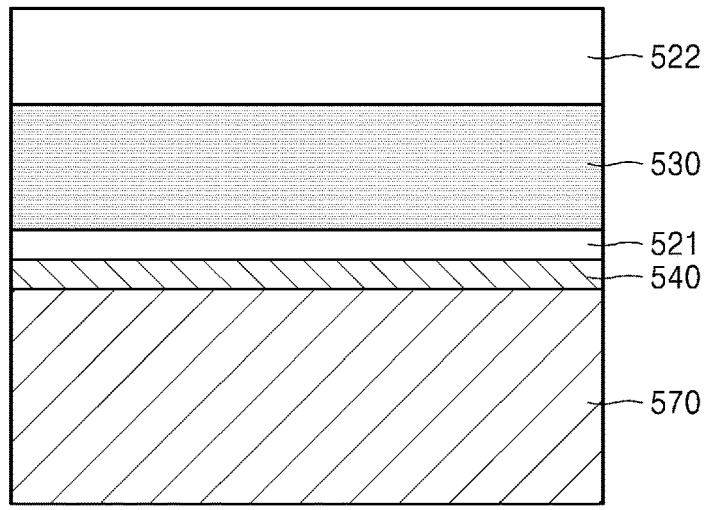
FIG. 13 is a first diagram illustrating a method of manufacturing a light detecting device, according to another embodiment.

Referring to FIG. 13, an InP substrate 570 is prepared. Here, as the InP substrate 570, for example, a InP wafer may be used. A low reflective layer 540 is deposited on the upper surface of the InP substrate 570. The low reflective layer 540 may include at least one of In, Ga, Al, and P, and As. The low reflective layer 540 may further include a certain dopant. The low reflective layer 540 may be formed in a single layer structure or may be formed in a multilayer structure in which different materials are stacked. The low reflective layer 540 may have a thickness that is tolerable by an etching process that will be described later. For example, the low reflective layer 540 may have a thickness, for example, equal to or greater than approximately 1 nm.

Next, the first semiconductor layer 521 is deposited on the upper surface of the low reflective layer 540. The first semiconductor layer 521 may include a material including at least one of In, Ga, Al, and As and P, and a certain dopant. The first semiconductor layer 521 may have a thin thickness so as to make light transmit therethrough in a wavelength range from visible light to SWIR. The first semiconductor layer 521 may have, for example, a thickness less than about 500 nm. For example, the first semiconductor layer 521 may have a thickness of approximately 10 nm to 300 nm (e.g., 10 nm to 100 nm).

A light absorbing layer 530 is deposited on the upper surface of the first semiconductor layer 521. The light absorbing layer 530 may include a semiconductor compound that absorbs light in a wavelength range from visible light to SWIR. The light absorbing layer 530 may include at least one of In, Ga, Al, and P, and As. A second semiconductor layer 522 is deposited on the upper surface of the light absorbing layer 530. The second semiconductor layer 522 may include a material including at least one of In, Ga, Al, and As and P, and a certain dopant.

Figure 14:
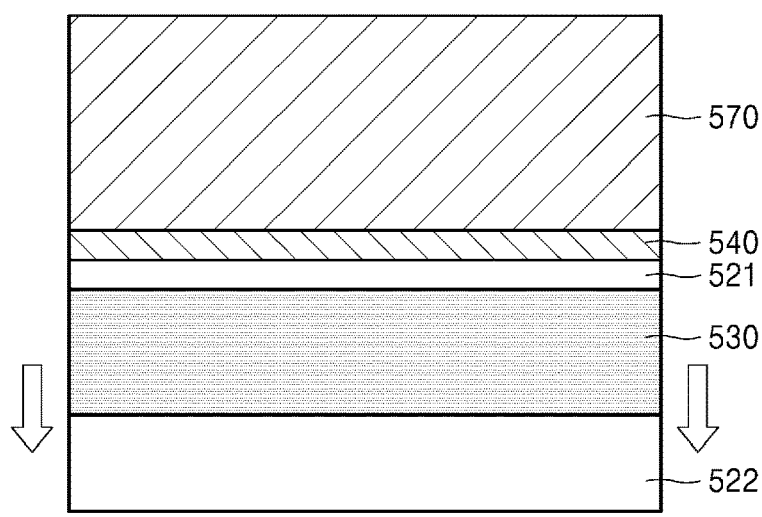
FIG. 14 is a second diagram illustrating the method of manufacturing the light detecting device, according to the another embodiment.
Figure 14:
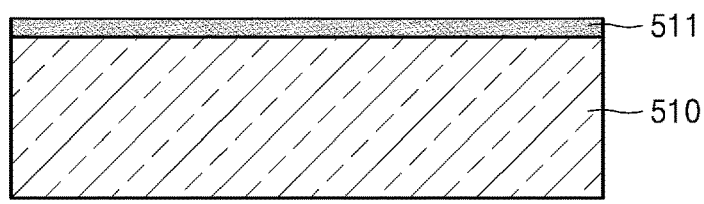

Referring to FIG. 14, the structure shown in FIG. 13 is turned over and bonded to a support substrate 510. Here, the second semiconductor layer 522 may be bonded to the support substrate 510 through an adhesive layer 511. Substrates of various materials may be used as the support substrate 510.

Figure 15:
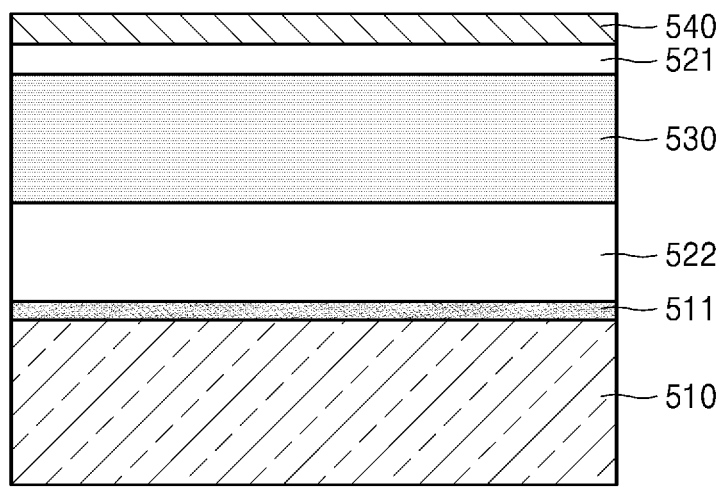
FIG. 15 is a third diagram illustrating the method of manufacturing the light detecting device, according to the another embodiment.

Referring to FIG. 15, an InP substrate 570 is removed through an etching process. Here, removal of the InP substrate 570 may be performed by wet etching or dry etching. Because the low reflective layer 540 includes a material having etch selectivity with respect to InP, only the InP substrate 570 may be removed by the etching process, and the low reflective layer 540 may remain on the first semiconductor layer 521.

Figure 16:
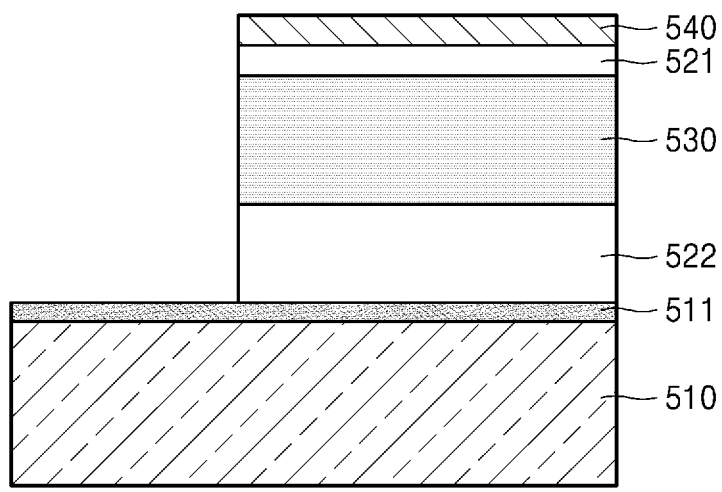
FIG. 16 is a fourth diagram illustrating the method of manufacturing the light detecting device, according to the another embodiment.

Referring to FIG. 16, the low reflective layer 540, the first semiconductor layer 521, the light absorbing layer 530, and the second semiconductor layer 522 are sequentially etched to form a mesa structure. In this process, a part of the adhesive layer 511 provided on the support substrate 510 may be exposed.

Figure 17:
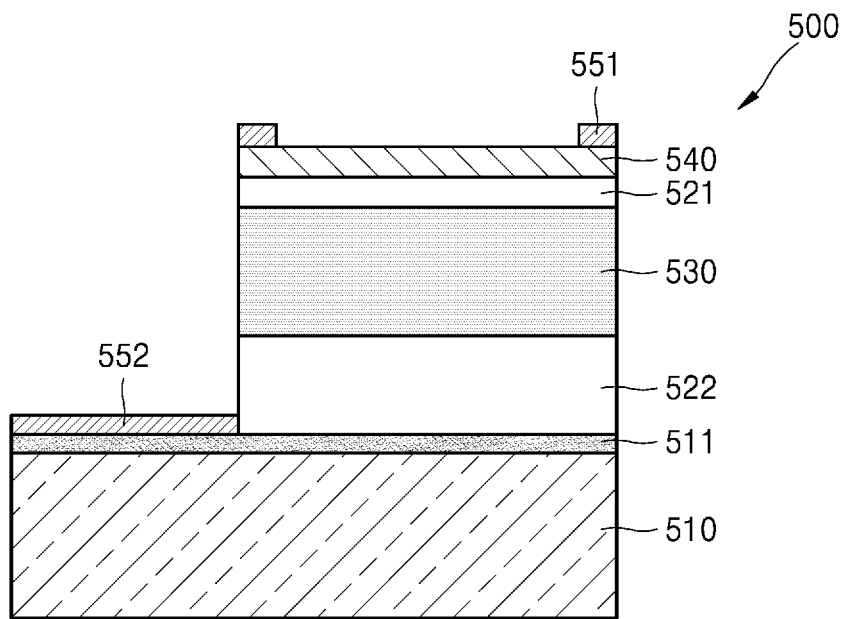
FIG. 17 is a fifth diagram illustrating the method of manufacturing the light detecting device, according to the another embodiment.

Referring to FIG. 17, a first electrode 551 electrically connected to the first semiconductor layer 521 is formed on the upper surface of the low reflective layer 540, and a second electrode 552 electrically connected to the second semiconductor layer 522 is formed on the adhesive layer 511 provided on the support substrate 510, and thus the light detecting device 500 may be manufactured.

FIGS. 18 to 22 are diagrams illustrating a method of manufacturing a light detecting device 600 according to another embodiment.

Figure 18:
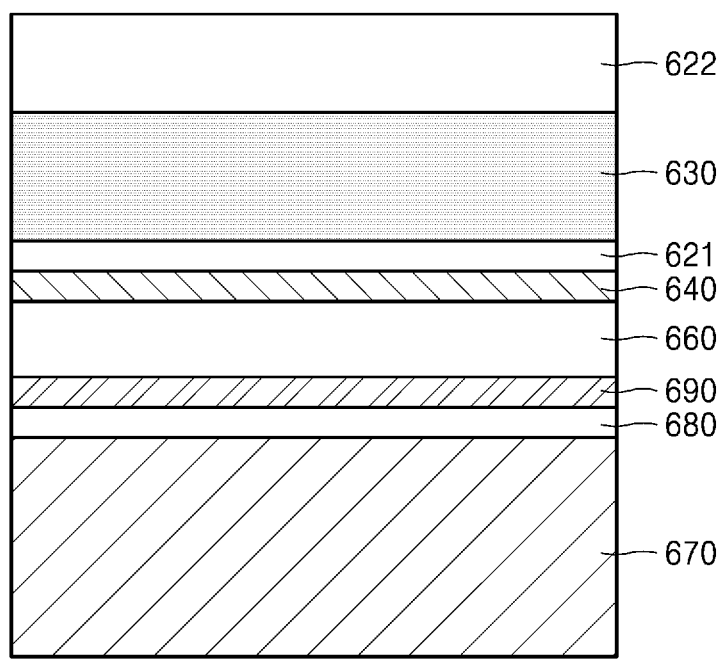
FIG. 18 is a first diagram illustrating a method of manufacturing a light detecting device, according to another embodiment.

Referring to FIG. 18, a Si substrate 670 is prepared. Here, as the Si substrate 670, for example, a Si wafer may be used. In addition, a first material layer 680, a second material layer 690, and a buffer layer 660 are sequentially formed on the Si substrate 670 by epitaxial growth.

The first material layer 680 may be formed by depositing at least one of, for example, Ge, GaP, and AlP on the upper surface of the Si substrate 670, and the second material layer 690 may be formed by depositing at least one of, for example, GaAs and AlAs on the upper surface of the first material layer 680. In addition, the buffer layer 660 may be formed by depositing, for example, InP on the upper surface of the second material layer 690.

It is described above that the Si substrate 670 is used. However, a Ge substrate or a GaAs substrate may be used instead of the Si substrate 670. When a Ge substrate (not shown) is used, a material layer including, for example, at least one of GaAs and AlAs may be formed on the upper surface of the Ge substrate, and a buffer layer including InP may be formed thereon. In addition, when a GaAs substrate (not shown) is used, the buffer layer including InP may be formed on the upper surface of the GaAs substrate. Meanwhile, substrates of various materials such as a glass substrate or a sapphire substrate may be used.

Subsequently, a low reflective layer 640 is deposited on the upper surface of the buffer layer 660. The low reflective layer 440 may include, for example, at least one of In, Ga, Al, and P, and As. The low reflective layer 640 may further include a certain dopant. The low reflective layer 640 may be formed in a single layer structure or may be formed in a multilayer structure in which different materials are stacked. For example, the low reflective layer 640 may have a thickness, for example, equal to or greater than approximately 1 nm.

Next, the first semiconductor layer 621 is deposited on the upper surface of the low reflective layer 640. Here, the first semiconductor layer 621 may include a material including at least one of In, Ga, Al, and As and P, and a certain dopant. For example, the first semiconductor layer 621 may include InP and a p-type dopant. The first semiconductor layer 621 may be formed to have a thickness less than approximately 500 nm (e.g., about 10 nm to 300 nm, for example, 10 nm to 100 nm) so as to make light transmit therethrough in a wavelength range from visible light to SWIR.

A light absorbing layer 630 is deposited on the upper surface of the first semiconductor layer 621. The light absorbing layer 630 may include a semiconductor compound that absorbs light in a wavelength range from visible light to SWIR. The light absorbing layer 630 may include at least one of In, Ga, Al, and P, and As. A second semiconductor layer 622 is deposited on the upper surface of the light absorbing layer 630. The second semiconductor layer 622 may include a material including at least one of In, Ga, Al, and As and P, and a certain dopant. For example, the second semiconductor layer 622 may include InP and an n-type dopant.

Figure 19:
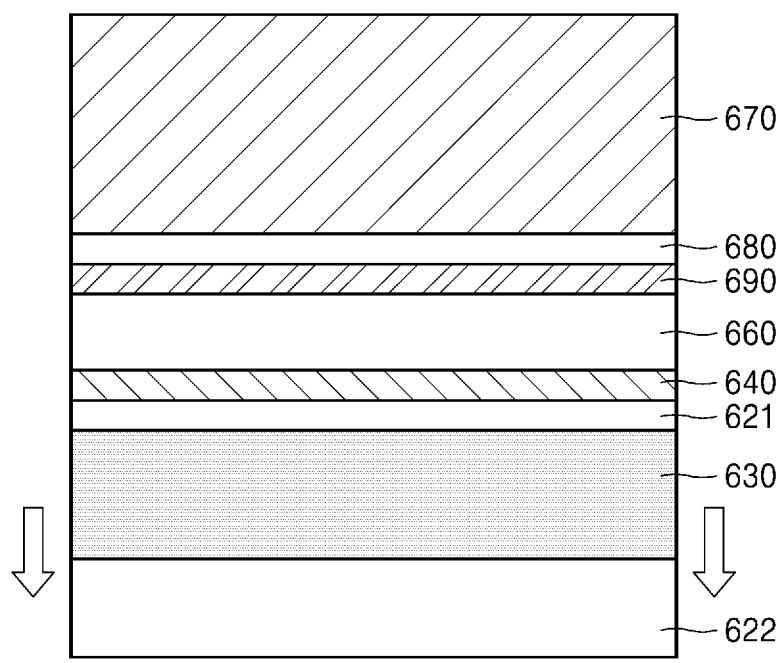
FIG. 19 is a second diagram illustrating the method of manufacturing the light detecting device, according to the another embodiment.
Figure 19:
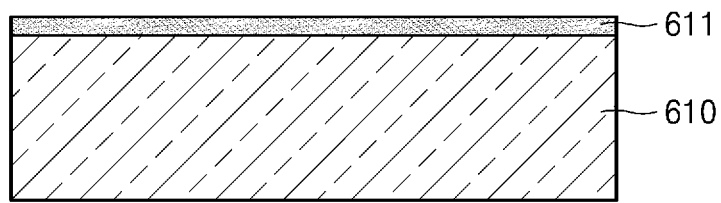

Referring to FIG. 19, the structure shown in FIG. 18 is turned over and bonded to a support substrate 610. Here, the second semiconductor layer 622 may be bonded to the support substrate 610 through an adhesive layer 611. When a Si wafer is used as the Si substrate 670, the support substrate 610 may have a size corresponding to the Si wafer. In this case, the second semiconductor layer 622 may be bonded to the support substrate 610 by wafer bonding.

Figure 20:
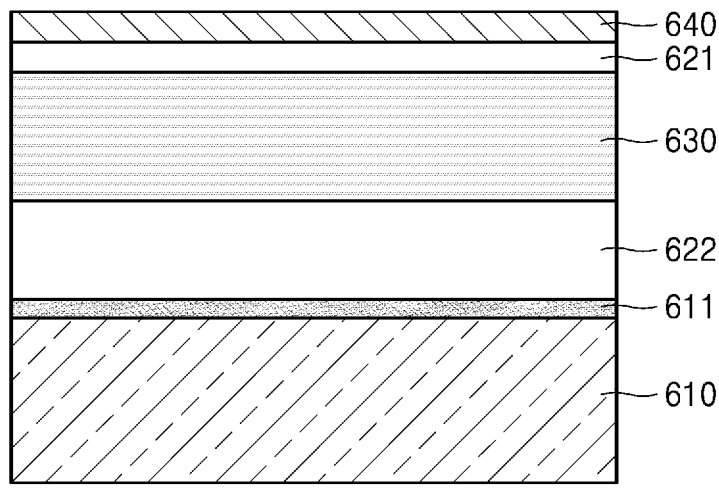
FIG. 20 is a third diagram illustrating the method of manufacturing the light detecting device, according to the another embodiment.
Figure 21:
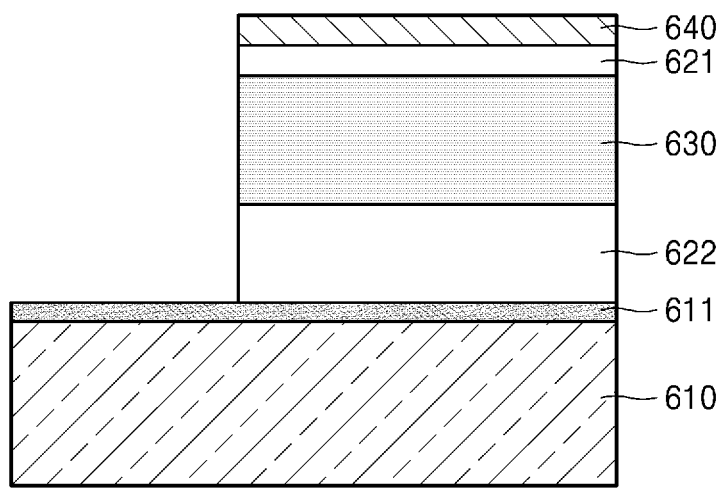
FIG. 21 is a fourth diagram illustrating the method of manufacturing the light detecting device, according to the another embodiment.

Referring to FIG. 20, the Si substrate 670, a first material layer 680, a second material layer 690, and a buffer layer 660 are removed through an etching process. Accordingly, the low reflective layer 640 may remain on the first semiconductor layer 621. Referring to FIG. 21, the low reflective layer 640, the first semiconductor layer 621, the light absorbing layer 630, and the second semiconductor layer 622 are sequentially etched to form a mesa structure. In this process, a part of the adhesive layer 611 provided on the support substrate 610 may be exposed.

Figure 22:
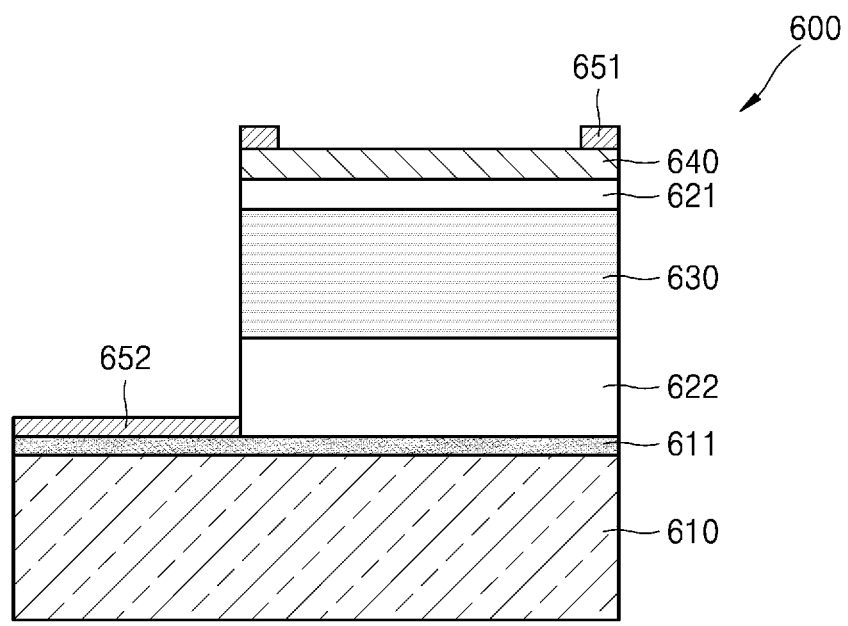
FIG. 22 is a fifth diagram illustrating the method of manufacturing the light detecting device, according to the another embodiment.

Referring to FIG. 22, a first electrode 651 electrically connected to the first semiconductor layer 621 is formed on the upper surface of the low reflective layer 640, and a second electrode 652 electrically connected to the second semiconductor layer 622 is formed on the adhesive layer 611 provided on the support substrate 610, and thus the light detecting device 600 may be manufactured.

Figure 23:
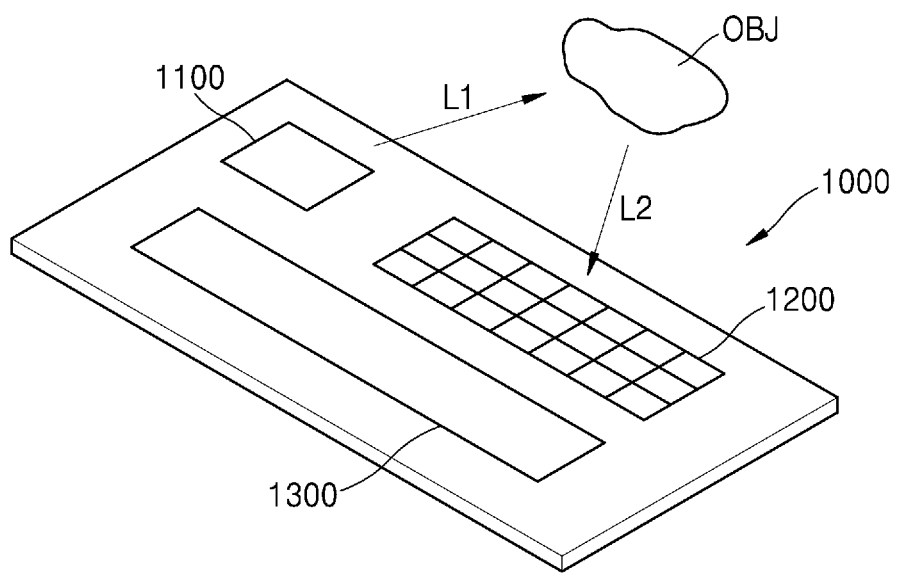
FIG. 23 schematically shows a light detecting system according to an embodiment.

FIG. 23 schematically shows a light detecting system 1000 according to an embodiment.

Referring to FIG. 23, the light detecting system 1000 includes a light source 1100 that emits and irradiates light L1 onto an object OBJ, at least one light detecting device 1200 that detects light L2 reflected from the object OBJ, and a controller 1300 that controls driving of the light source 1100 and the at least one light detecting device 1200.

The light source 1100 may be, for example, a laser diode, a light emitting diode, or a halogen lamp, but is not limited thereto. The light L1 emitted from the light source 1100 is irradiated onto the object OBJ, and the light L2 of a certain wavelength band may be reflected from the object OBJ.

Each of the at least one light detecting device 1200 may absorb and detect the light L2 in a certain wavelength band reflected from the object OBJ, for example, in a wavelength band from visible light to SWIR. Here, each of the at least one light detecting device 1200 may be one from among the light detecting device 100 and the light detecting device 200 shown in FIGS. 1 and 4 described above. The light detecting system 1000 as described above may be applied to various devices such as a camera, a mobile phone, a laptop computer, vehicle, etc.

According to the above embodiment, because the first semiconductor layer provided on the light incident surface of the light absorbing layer is provided with a thickness less than 500 nm, light within a wavelength range from visible light to SWIR may be transmitted, and accordingly, a light detecting device having a broadband characteristic may be implemented. In addition, the low reflective layer provided on the first semiconductor layer may prevent reflection of incident light, may mechanically, chemically, and electrically protect the first semiconductor layer of a thin thickness, and may perform a function of an etch stop layer in the manufacturing process of the light detecting device.

According to another embodiment, the first semiconductor layer is deposited in a thin thickness on the light absorbing layer and then the transparent low reflective layer having etch selectivity with respect to the first semiconductor layer is deposited thereon, and thus a light detecting device capable of detecting light in the wavelength region from visible light to SWIR may be manufactured. In addition, a light detecting structure is formed by using a Si wafer, and thus the light detecting device may be mass-produced at a relatively low cost.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure.

What is claimed is:

1. A light detecting device comprising:
a light absorbing layer configured to absorb light in a wavelength range from visible light to short-wave infrared (SWIR);
a first semiconductor layer provided on a first surface of the light absorbing layer;
an anti-reflective layer provided on the first semiconductor layer and comprising a material having etch selectivity with respect to the first semiconductor layer; and
a second semiconductor layer provided on a second surface of the light absorbing layer,
wherein the first semiconductor layer has a thickness less than 500 nm so as to be configured to allow light to transmit therethrough in the wavelength range from visible light to SWIR, and
wherein the anti-reflective layer comprises As and at least one from among In, Ga, Al, and P, and the anti-reflective layer further comprises a dopant.

2. The light detecting device of claim 1, wherein the light absorbing layer comprises As and at least one from among In, Ga, Al, and P.

3. The light detecting device of claim 1, wherein each of the first semiconductor layer and the second semiconductor layer comprises P and at least one from among In, Ga, Al, and As.

4. The light detecting device of claim 1, wherein the thickness of the first semiconductor layer is 10 nm to 300 nm.

5. The light detecting device of claim 1, wherein the anti-reflective layer has a thickness equal to or greater than 1 nm.

6. A light detecting device array comprising a plurality of the light detecting device of claim 1, wherein the plurality of the light detecting device are arranged one-dimensionally or two-dimensionally.

7. A light detecting system comprising:
a light source; and
a light detecting device configured to detect light, reflected from an object, that is emitted from the light source,
wherein the light detecting device comprises:
a light absorbing layer configured to absorb light in a wavelength range from visible light to short-wave infrared (SWIR);
a first semiconductor layer provided on a first surface of the light absorbing layer;
an anti-reflective layer provided on the first semiconductor layer and comprising a material having etch selectivity with respect to the first semiconductor layer; and
a second semiconductor layer provided on a second surface of the light absorbing layer,
wherein the first semiconductor layer has a thickness less than 500 nm so as to be configured to allow light to transmit therethrough in the wavelength range from visible light to SWIR, and
wherein the anti-reflective layer comprises As and at least one from among In, Ga, Al, and P, and the anti-reflective layer further comprises a dopant.

8. A method of manufacturing a light detecting device, the method comprising:
sequentially forming, on a substrate, an anti-reflective layer, a first semiconductor layer, a light absorbing layer, a second semiconductor layer, and an electrode;
attaching the electrode to a circuit substrate; and
removing the substrate by etching,
wherein the first semiconductor layer is formed to a thickness less than 500 nm, and the anti-reflective layer includes a material having an etch selectivity with respect to the first semiconductor layer, and
wherein the anti-reflective layer includes As and at least one from among In, Ga, Al, and P, and the anti-reflective layer further includes a dopant.

9. The method of claim 8, wherein the light absorbing layer includes As and at least one from among In, Ga, Al, and P, and each of the first semiconductor layer and the second semiconductor layer includes P and at least one from among In, Ga, Al, and As.

10. The method of claim 8, wherein the thickness of the first semiconductor layer is 10 nm to 300 nm.

11. The method of claim 8, wherein the anti-reflective layer has a thickness equal to or greater than 1 nm.

12. The method of claim 8, wherein the substrate includes an InP substrate.

13. The method of claim 8, wherein the substrate includes a Si substrate, a Ge substrate, or a GaAs substrate.

14. A method of manufacturing a light detecting device, the method comprising:
sequentially forming, on a substrate, an anti-reflective layer, a first semiconductor layer, a light absorbing layer, and a second semiconductor layer;
bonding the second semiconductor layer to a support substrate; and
removing the substrate by etching,
wherein the first semiconductor layer is formed to a thickness less than 500 nm, and the anti-reflective layer includes a material having an etch selectivity with respect to the first semiconductor layer, and
wherein the anti-reflective layer includes As and at least one from among In, Ga, Al, and P, and the anti-reflective layer further includes a dopant.

15. The method of claim 14, further comprising:
forming a mesa structure by sequentially etching the anti-reflective layer, the first semiconductor layer, the light absorbing layer, and the second semiconductor layer; and
forming electrodes electrically connected to the first semiconductor layer and the second semiconductor layer.

16. The method of claim 14, wherein the second semiconductor layer is bonded to the support substrate by wafer bonding.

17. The method of claim 14, wherein the substrate includes an InP substrate, a Si substrate, a Ge substrate, or a GaAs substrate.

* * * * *